US011171621B2

(12) United States Patent
Noertker et al.

(10) Patent No.: US 11,171,621 B2
(45) Date of Patent: Nov. 9, 2021

(54) PERSONALIZED EQUALIZATION OF AUDIO OUTPUT BASED ON AMBIENT NOISE DETECTION

(71) Applicant: Facebook Technologies, LLC, Menlo Park, CA (US)

(72) Inventors: Samuel Steele Noertker, Redmond, WA (US); Andrew Lovitt, Redmond, WA (US); Tetsuro Oishi, Bothell, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/809,518

(22) Filed: Mar. 4, 2020

(65) Prior Publication Data

US 2021/0281232 A1 Sep. 9, 2021

(51) Int. Cl.
*H03G 5/16* (2006.01)
*H04R 29/00* (2006.01)
(Continued)

(52) U.S. Cl.
CPC ............. *H03G 5/165* (2013.01); *G06F 3/165* (2013.01); *G10L 25/51* (2013.01); *H04R 3/04* (2013.01); *H04R 29/001* (2013.01)

(58) Field of Classification Search
CPC .......... H03G 5/165; H03G 1/00; H03G 3/00; H03G 3/20; H03G 3/24; H03G 3/301; H03G 3/32; G06F 3/16; G06F 3/162; G06F 3/165; G06F 3/167; H04R 3/04; H04R 3/00; H04R 3/02; H04R 3/06; H04R 3/08;
(Continued)

(56) References Cited

U.S. PATENT DOCUMENTS

| 7,903,825 B1 * | 3/2011 | Melanson ................ H03G 3/32 |
| | | 381/57 |
| 2005/0248717 A1 * | 11/2005 | Howell ................ G02C 11/06 |
| | | 351/41 |

(Continued)

FOREIGN PATENT DOCUMENTS

| EP | 2136362 A1 | 12/2009 |
| GB | 2545222 A | 6/2017 |
| JP | 2006173839 A | 6/2006 |

OTHER PUBLICATIONS

PCT International Search Report and Written Opinion, PCT Application No. PCT/US2021/016647, dated May 12, 2021, 10 pages.

*Primary Examiner* — Andrew C Flanders
(74) *Attorney, Agent, or Firm* — Fenwick & West LLP

(57) ABSTRACT

An audio playback device detects via an acoustic sensor of an audio playback device, ambient noise surrounding the audio playback device. The audio playback device updates an equalization filter based on the detected ambient noise, wherein the equalization filter adjusts one or more acoustic parameters of content presented by the audio playback device. The audio playback device adjusts a leakage control parameter based on the detected ambient noise, wherein the leakage control parameter adjusts an amount of leakage of content presented by the audio playback device. The audio playback device applies the equalization filter and the adjusted leakage control parameter to audio content. The audio playback device provides, via one or more acoustic speakers, the audio content to a user.

20 Claims, 6 Drawing Sheets

(51) Int. Cl.
  *H04R 3/04* (2006.01)
  *G06F 3/16* (2006.01)
  *G10L 25/51* (2013.01)

(58) Field of Classification Search
  CPC ...... H04R 3/12; H04R 29/001; H04R 1/1083;
    H04R 2225/39; H04R 2227/001; H04R
    2430/00; H04R 2430/01; H04R 2430/03;
    H04R 2460/01; H04R 29/00; H04R
    29/002; H04R 29/007; H04R 29/008;
    H04R 5/033; H04R 5/04; G10L 25/51;
    H04S 2400/09; H04S 2400/13; H04S
    2400/15; H04S 77/00; H04S 77/30; H04S
    77/301; H04S 77/302; H04S 77/303;
    H04S 77/304; H04S 77/305; H04S
    77/306; H04S 77/307; H04S 77/308
  See application file for complete search history.

(56) References Cited

U.S. PATENT DOCUMENTS

| | | | | |
|---|---|---|---|---|
| 2007/0172086 A1* | 7/2007 | Dickins | ............... | H04S 7/306 381/309 |
| 2008/0089524 A1* | 4/2008 | Takeuchi | ............... | H04K 3/43 381/57 |
| 2008/0118078 A1* | 5/2008 | Asada | ............... | H04S 3/008 381/74 |
| 2008/0153537 A1* | 6/2008 | Khawand | ............... | H03G 3/32 455/550.1 |
| 2009/0010442 A1* | 1/2009 | Usher | ............... | H04R 3/04 381/57 |
| 2009/0154713 A1* | 6/2009 | Kamiya | ............... | H04S 7/302 381/1 |
| 2010/0322430 A1* | 12/2010 | Isberg | ............... | G10K 11/17817 381/58 |
| 2011/0137649 A1 | 6/2011 | Rasmussen et al. | | |
| 2011/0305346 A1* | 12/2011 | Daubigny | ............... | H03G 3/32 381/28 |
| 2013/0287215 A1* | 10/2013 | Kim | ............... | H03G 3/02 381/57 |
| 2014/0029762 A1* | 1/2014 | Xie | ............... | H04R 5/027 381/94.1 |
| 2014/0044269 A1* | 2/2014 | Anderson | ............... | H04R 5/04 381/57 |
| 2014/0270254 A1* | 9/2014 | Oishi | ............... | H04R 1/1041 381/98 |
| 2014/0307888 A1* | 10/2014 | Alderson | ............... | G10K 11/1783 381/71.8 |
| 2014/0341388 A1* | 11/2014 | Goldstein | ............... | G10K 11/178 381/71.11 |
| 2015/0281853 A1* | 10/2015 | Eisner | ............... | H04R 25/505 381/312 |
| 2015/0326196 A1* | 11/2015 | Park | ............... | H03G 3/20 381/107 |
| 2016/0112817 A1* | 4/2016 | Fan | ............... | H04R 29/004 381/94.7 |
| 2017/0053666 A1* | 2/2017 | Konjeti | ............... | H03G 3/342 |
| 2017/0195811 A1* | 7/2017 | Yen | ............... | H04R 29/001 |
| 2017/0269901 A1* | 9/2017 | Klimanis | ............... | H04R 1/1083 |
| 2017/0324390 A1* | 11/2017 | Wheatley | ............... | H03G 9/025 |
| 2018/0367937 A1* | 12/2018 | Asada | ............... | H04S 7/303 |
| 2019/0058952 A1* | 2/2019 | Nawfal | ............... | H04R 5/04 |
| 2019/0349703 A1* | 11/2019 | Zilberman | ............... | H04S 3/008 |
| 2019/0394602 A1* | 12/2019 | Moore | ............... | H04R 1/403 |

* cited by examiner

400

Detect, via an acoustic sensor of the audio playback device, ambient noise surrounding the audio playback device
410

Update an equalization filter based on the detected ambient noise, wherein the equalization filter adjusts one or more acoustic parameters of content presented by the audio playback device
420

Adjust a leakage control parameter, wherein the leakage control parameter adjusts an amount of leakage of content presented by the audio playback device
430

Apply the adjusted leakage control parameter and the equalization filter to audio content
440

Provide, via one or more acoustic speakers, the audio content to a user
450

FIG. 4

PERSONALIZED EQUALIZATION OF AUDIO OUTPUT BASED ON AMBIENT NOISE DETECTION

FIELD OF THE INVENTION

This disclosure relates generally to artificial reality systems, and more specifically to generating an equalization filter of audio output for a user.

BACKGROUND

Existing headsets, such as artificial reality (AR) and virtual reality (VR) headsets, often provide audio content to a user using a plurality of transducers. Typically, when moving between environments with differing levels of ambient noise, if the audio output is constant, then a user's perception of the audio output can change depending on the levels of ambient noise. Moreover, between users, distinctions in anatomical features of users' ears and fitment inconsistencies cause differences in perception of audio content provided by a headset. There is, thus, a need for personalization of audio output to accommodate these variations.

SUMMARY

A method comprises detecting, via an acoustic sensor of an audio playback device, ambient noise surrounding the audio playback device. The method includes updating an equalization filter based on the detected ambient noise, wherein the equalization filter adjusts one or more acoustic parameters of content presented by the audio playback device. The method includes adjusting a leakage control parameter based on the detected ambient noise, wherein the leakage control parameter adjusts an amount of leakage of content presented by the audio playback device. The method includes applying the equalization filter and the adjusted leakage control parameter to audio content. The method includes providing, via one or more acoustic speakers, the audio content to a user. In one embodiment, a non-transitory computer-readable storage medium for performing the method is also disclosed.

An audio playback device is also disclosed comprising an acoustic sensor, an audio controller, and one or more acoustic speakers. The acoustic sensor is configured to detect ambient noise surrounding the audio playback device. The audio controller is configured to: update an equalization filter based on the detected ambient noise, wherein the equalization filter adjusts one or more acoustic parameters of content presented by the audio playback device, adjust a leakage control parameter based on the detected ambient noise, wherein the leakage control parameter adjusts an amount of leakage of content presented by the audio playback device, apply the equalization filter and the adjusted leakage control parameter to audio content. The one or more acoustic speakers configured to provide the audio content.

BRIEF DESCRIPTION OF THE DRAWINGS

FIG. 4 illustrates a method of adjusting an equalization filter based on ambient noise detection, in accordance with one or more embodiments.

Figure 1A:
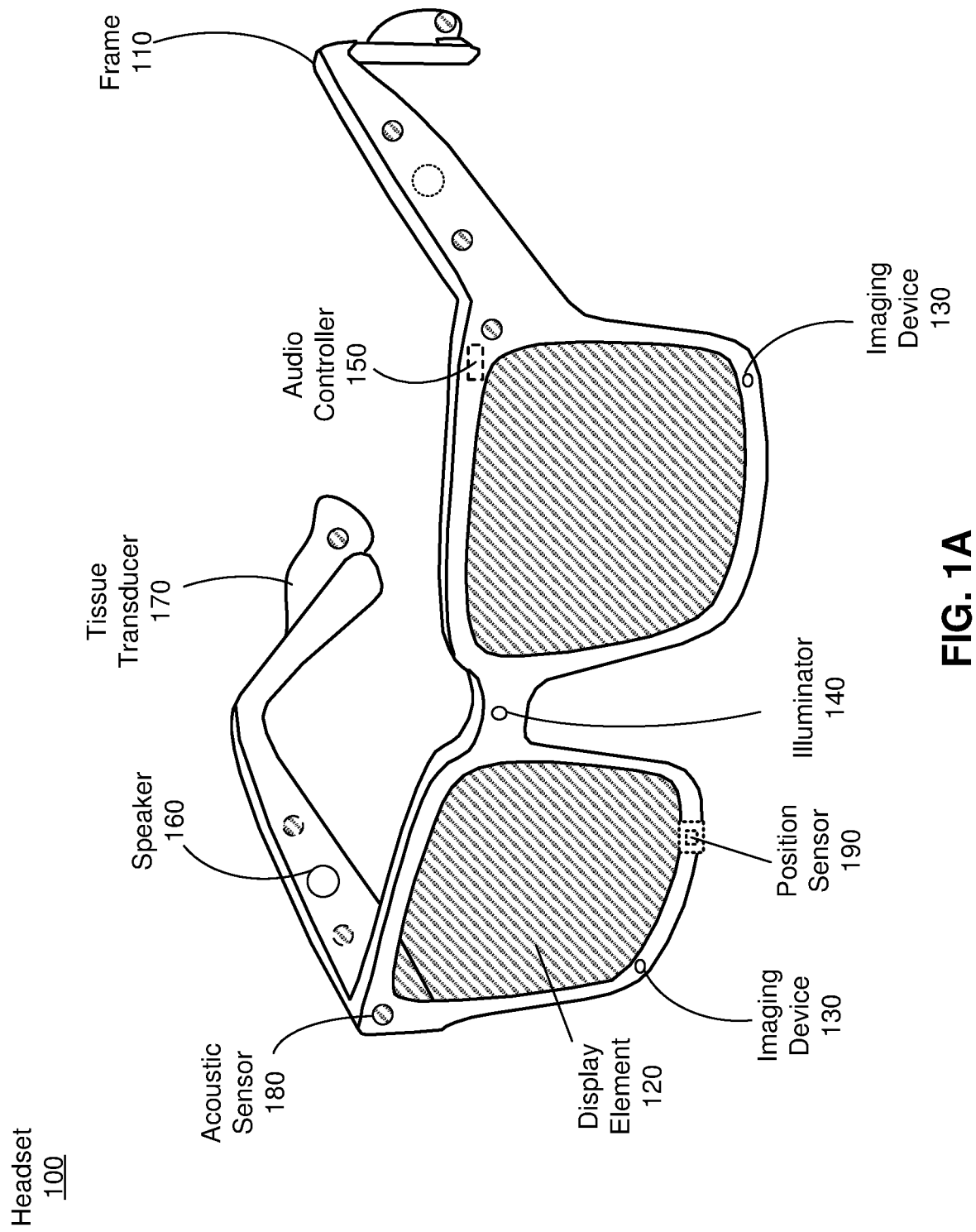
FIG. 1A is a perspective view of a first embodiment of a headset, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Overview

A headset, such as an artificial reality (AR) headset, includes one or more transducers (e.g., speakers) for providing audio content to a user. Sound propagation from the transducers to a user's ears, however, can vary from user to user and device to device. In particular, an audio output at the ear of the user can vary based on the anthropometric features of the user's ear and/or head. Anthropometric features are physical characteristics of a user (e.g., ear shape, ear size, ear orientation/position on head, head size, etc.). Additionally, the fit of a headset can vary based on the anthropometric features, also affecting the audio output response. Moreover, varying environments with different levels ambient noise can influence how a user perceives the audio output. For example, an outdoor city environment with high levels of ambient noise can detract from the audio output compared to an indoor library environment with low levels of ambient noise.

As such, it may be useful to adjust the audio content provided to the user by a headset such that the user experiences a personalized audio output response to enhance user experience and provide high quality content to the user. Accordingly, an equalization filter that adjusts one or more acoustic parameters of the audio output (e.g., wavelength, frequency, volume, pitch, balance, other spectral content, acoustic time delay, etc.) is maintained for a user. The equalization filter, when applied to the audio content, adjusts the audio content to a target response at the ear of the user so that the user perceives the audio content as a creator of the audio content intended it to be heard. In one embodiment, the target response is associated with predetermined values (or a range of acceptable values) for each of a set of acoustic parameters. The predetermined values (or range of acceptable values) for each of the set of acoustic parameters correspond to a relatively high acceptable threshold of sound quality that a content creator intended the audio content to be perceived by the user.

In embodiments with ambient noise detection, an audio playback device is configured to adjust the audio content response according to detected ambient noise. The audio playback device comprises one or more acoustic sensors configured to detect the ambient noise in an environment surrounding the audio playback device. The audio playback device may adjust an equalization filter according to the detected ambient noise. For example, in detecting a presence of a loud high pitch frequency in the ambient noise, the audio playback device may adjust the equalization filter to increase an audio output response in the high frequency range. The audio playback device may also adjust a leakage control parameter that controls an amount of leakage by the audio playback device. Leakage refers to the transmission of the audio output into the local area of the audio playback device, e.g., where other humans may hear the audio output intended for the user of the audio playback device. Adjusting the audio content in response to ambient noise is advantageous in that audio output response is maintained in a variety of environments. This mitigates situations in which a user transitions between environments of differing levels of ambient noise that would otherwise negatively affect the user's perception of the audio content.

In some embodiments, the audio playback device may classify an environment that the audio playback device is in according to the detected ambient noise. In one example, the audio playback device classifies between a noisy environment and a quiet environment according to a threshold decibel value. This classification may be binary (i.e., noisy or quiet) or the classification can be a sliding scale based on the decibel value that encompasses many values between noisy and quiet. According to the classified environment, the audio playback device selects an equalization filter associated with the classified environment. Similarly, the audio playback device may select a leakage control parameter according to the classification, e.g., a high leakage control in a quiet environment. In these embodiments, each environment may be assigned a distinct equalization filter and a distinct leakage control parameter.

In other embodiments, the audio playback device may update an equalization filter and/or a leakage control parameter according to user input. In these embodiments, the audio playback device comprises an input interface configured to receive one or more user inputs. Some user inputs may directly indicate adjustments to one or more acoustic parameters of the equalization filter, e.g., increase volume, decrease bass response, etc, and/or the leakage control parameter. Other user inputs may be used by the audio playback device to infer one or more adjustments to the equalization filter and/or the leakage control parameter. With the user inputs, the audio playback device adjusts the equalization filter and/or the leakage control parameter, thereby personalizing to the user. The audio playback device may also store personalized equalization filters and/or personalized leakage control parameters for various users of the audio playback device. In other embodiments, the audio playback device may provide the personalized equalization filters and/or personalized leakage control parameters to an online system for storage in user profiles associated with the users.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

Example Headsets

FIG. 1A is a perspective view of a first embodiment of a headset 100, in accordance with one or more embodiments. In some embodiments, the headset 100 is a near eye display (NED) or eyewear device. In general, the headset 100 may be worn on the face of a user such that content (e.g., media content) is presented using a display assembly and/or an audio system. However, the headset 100 may also be used such that media content is presented to a user in a different manner. Examples of media content presented by the headset 100 include one or more images, video, audio, or some combination thereof. The headset 100 includes a frame 110, and may include, among other components, a display assembly including one or more display elements 120, a depth camera assembly (DCA), an audio system, and a position sensor 190. While FIG. 1A illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1A.

The frame 110 holds the other components of the headset 100. The frame 110 includes a front part that holds the one or more display elements 120 and end pieces (e.g., temples) to attach to a head of the user. The front part of the frame 110 bridges the top of a nose of the user. The length of the end pieces may be adjustable (e.g., adjustable temple length) to fit different users. The end pieces may also include a portion that curls behind the ear of the user (e.g., temple tip, ear piece).

The one or more display elements 120 provide light to a user wearing the headset 100. As illustrated the headset includes a display element 120 for each eye of a user. In some embodiments, a display element 120 generates image light that is provided to an eye-box of the headset 100. The eye-box is a location in space that an eye of user occupies while wearing the headset 100. For example, a display element 120 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eye-box of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 120 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 120 are at least partially transparent, such that light from the local area may be combined with light from the one or more display elements to produce AR and/or MR content.

In some embodiments, a display element 120 does not generate image light, and instead is a lens that transmits light from the local area to the eye-box. For example, one or both of the display elements 120 may be a lens without correction (non-prescription) or a prescription lens (e.g., single vision, bifocal and trifocal, or progressive) to help correct for defects in a user's eyesight. In some embodiments, the display element 120 may be polarized and/or tinted to protect the user's eyes from the sun.

Note that in some embodiments, the display element 120 may include an additional optics block (not shown). The optics block may include one or more optical elements (e.g., lens, Fresnel lens, etc.) that direct light from the display element 120 to the eye-box. The optics block may, e.g., correct for aberrations in some or all of the image content, magnify some or all of the image, or some combination thereof.

The DCA determines depth information for a portion of a local area surrounding the headset 100. The DCA includes one or more imaging devices 130 and a DCA controller (not shown in FIG. 1A), and may also include an illuminator 140. In some embodiments, the illuminator 140 illuminates a portion of the local area with light. The light may be, e.g., structured light (e.g., dot pattern, bars, etc.) in the infrared (IR), IR flash for time-of-flight, etc. In some embodiments, the one or more imaging devices 130 capture images of the portion of the local area that include the light from the illuminator 140. As illustrated, FIG. 1A shows a single illuminator 140 and two imaging devices 130. In alternate embodiments, there is no illuminator 140 and at least two imaging devices 130.

The DCA controller computes depth information for the portion of the local area using the captured images and one or more depth determination techniques. The depth determination technique may be, e.g., direct time-of-flight (ToF) depth sensing, indirect ToF depth sensing, structured light, passive stereo analysis, active stereo analysis (uses texture added to the scene by light from the illuminator 140), some other technique to determine depth of a scene, or some combination thereof.

The audio system provides audio content. The audio system includes a transducer array, a sensor array, and an audio controller 150. However, in other embodiments, the audio system may include different and/or additional components. Similarly, in some cases, functionality described with reference to the components of the audio system can be distributed among the components in a different manner than is described here. For example, some or all of the functions of the audio controller may be performed by a remote server.

The transducer array presents sound to user. The transducer array includes a plurality of transducers. A transducer may be a speaker 160, a tissue transducer 170 (e.g., a bone conduction transducer or a cartilage conduction transducer), or other transducer (e.g., a diaphragm or membrane based transducer). Although the speakers 160 are shown exterior to the frame 110, the speakers 160 may be enclosed in the frame 110. In some embodiments, instead of individual speakers for each ear, the headset 100 includes a speaker array comprising multiple speakers integrated into the frame 110 to improve directionality of presented audio content. The tissue transducer 170 couples to the head of the user and directly vibrates tissue (e.g., bone or cartilage) of the user to generate sound. The number and/or locations of transducers may be different from what is shown in FIG. 1A.

The sensor array detects sounds within the local area of the headset 100. The sensor array includes a plurality of acoustic sensors 180. An acoustic sensor 180 captures sounds emitted from one or more sound sources in the local area (e.g., a room). Each acoustic sensor is configured to detect sound and convert the detected sound into an electronic format (analog or digital). The acoustic sensors 180 may be acoustic wave sensors, microphones, sound transducers, or similar sensors that are suitable for detecting sounds.

In some embodiments, one or more acoustic sensors 180 may be placed in an ear canal of each ear (e.g., acting as binaural microphones). In some embodiments, the acoustic sensors 180 may be placed on an exterior surface of the headset 100, placed on an interior surface of the headset 100, separate from the headset 100 (e.g., part of some other device), or some combination thereof. The number and/or locations of acoustic sensors 180 may be different from what is shown in FIG. 1A. For example, the number of acoustic detection locations may be increased to increase the amount of audio information collected and the sensitivity and/or accuracy of the information. The acoustic detection locations may be oriented such that the microphone is able to detect sounds in a wide range of directions surrounding the user wearing the headset 100.

The audio controller 150 processes information from the sensor array that describes sounds detected by the sensor array. The audio controller 150 may comprise a processor and a computer-readable storage medium. The audio controller 150 may be configured to generate direction of arrival (DOA) estimates, generate acoustic transfer functions (e.g., array transfer functions and/or head-related transfer functions), track the location of sound sources, form beams in the direction of sound sources, classify sound sources, generate sound filters for the speakers 160, or some combination thereof. In particular, the audio controller 150 is configured to receive detected ambient noise from the sensor array and to adjust audio output response based on the detected ambient noise, e.g., by adjusting an equalization filter and/or a leakage control parameter. The audio controller 150 adjusts the audio output response by applying the equalization filter to the audio content and adjusting leakage with the leakage control parameter. The audio controller 150 provides the audio content to the speaker array for presenting the audio content.

The position sensor 190 generates one or more measurement signals in response to motion of the headset 100. The position sensor 190 may be located on a portion of the frame 110 of the headset 100. The position sensor 190 may include an inertial measurement unit (IMU). Examples of position sensor 190 include: one or more accelerometers, one or more gyroscopes, one or more magnetometers, another suitable type of sensor that detects motion, a type of sensor used for error correction of the IMU, or some combination thereof. The position sensor 190 may be located external to the IMU, internal to the IMU, or some combination thereof.

In some embodiments, the headset 100 may provide for simultaneous localization and mapping (SLAM) for a position of the headset 100 and updating of a model of the local area. For example, the headset 100 may include a passive camera assembly (PCA) that generates color image data. The PCA may include one or more Red, Green, Blue, (RGB) cameras that capture images of some or all of the local area. In some embodiments, some or all of the imaging devices 130 of the DCA may also function as the PCA. The images captured by the PCA and the depth information determined by the DCA may be used to determine parameters of the local area, generate a model of the local area, update a model of the local area, or some combination thereof. Furthermore, the position sensor 190 tracks the position (e.g., location and pose) of the headset 100 within the room. Additional details regarding the components of the headset 100 are discussed below in connection with FIG. 10.

Figure 1B:
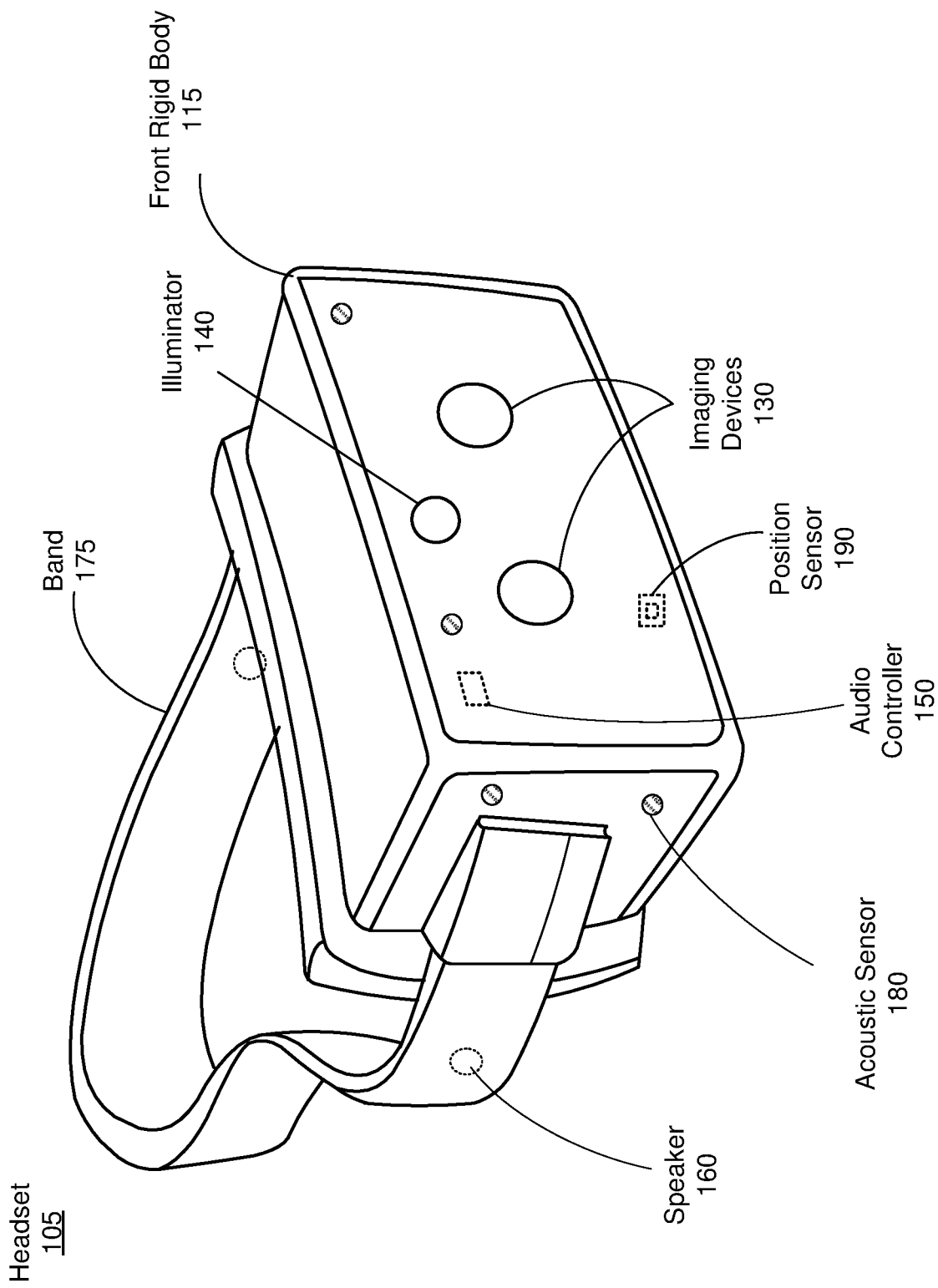
FIG. 1B is a perspective view of a second embodiment of a headset, in accordance with one or more embodiments.

FIG. 1B is a perspective view of a second embodiment of a headset 105 implemented as a head-mounted display (HMD), in accordance with one or more embodiments. In embodiments that describe an AR system and/or a MR system, portions of a front side of the HMD are at least partially transparent in the visible band (~380 nm to 750 nm), and portions of the HMD that are between the front side of the HMD and an eye of the user are at least partially transparent (e.g., a partially transparent electronic display). The HMD includes a front rigid body 115 and a band x175. The headset 105 includes many of the same components described above with reference to FIG. 1A, but modified to integrate with the HMD form factor. For example, the HMD includes a display assembly, a DCA, an audio system, and a position sensor 190. FIG. 1B shows the illuminator 140, a plurality of the speakers 160, a plurality of the imaging devices 130, a plurality of acoustic sensors 180, and the position sensor 190.

System Environment for Providing Personalized Audio Content

Figure 2:
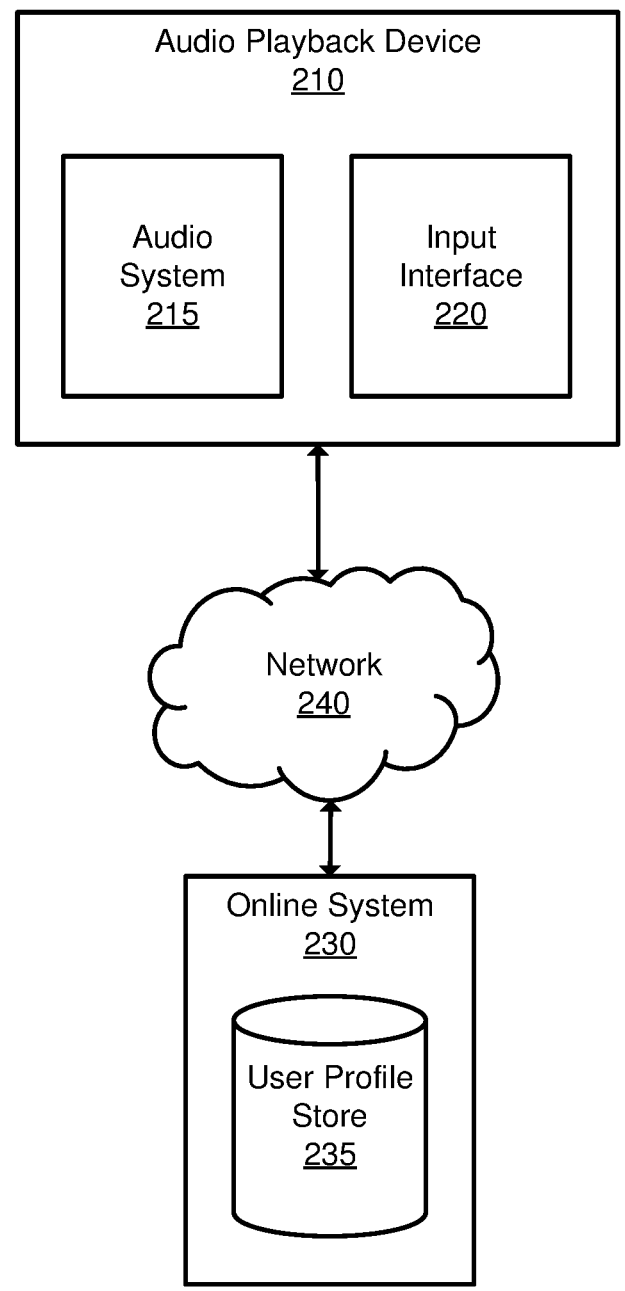
FIG. 2 illustrates a system environment for providing audio content to an audio playback device, in accordance with one or more embodiments.

FIG. 2 illustrates a system environment 200 for providing individualized audio content via an audio playback device 210 to a user, in accordance with one or more embodiments. The system environment 200 includes an audio playback device 210, an imaging system 220, and an online system 230 connected via a network 240. The system environment 200 can include fewer or additional components than described herein. Additionally, the structure and/or functions of the components may be different than described herein.

The audio playback device 210 is a device (e.g., headset 100, headset 105) configured to present audio to a user. The audio playback device 210 is also configured to be worn by a user at the user's head region. The audio playback device 210 includes an audio system 215 and an input interface 220. The audio playback device 210 may implement the audio system 215 so as to occlude the user's ear or not to occlude the user's ear. In embodiments where the audio system 215 does not occlude the user's ear, adjustment of the audio content (via one or more equalization filters and/or a leakage control parameter) is ensures fidelity of the audio content throughout varying sound environment that would particularly perceivable by a user of the non-occluding audio system 215. In some embodiments, the audio playback device 210 includes additional components (e.g., a display system, haptic feedback system) for providing other types of content (e.g., digital content, haptic content) to a user.

The audio system 215 is configured to provide audio content to a user wearing the audio playback device 210. The audio system 215 can include a transducer array, a sensor array, and an audio controller. The transducer array includes one or more transducers (e.g., speakers) for generating acoustic pressure waves that constitute the audio content. The sensor array includes one or more acoustic sensors for detecting sound in a local area of the audio playback device 210. The audio controller maintains one or more equalization filters that may be applied to the audio content according to ambient noise detected in the local area. The audio controller may also utilize a leakage control parameter to control an amount of leakage by the audio playback device 210. In some embodiments, the audio system 215 generates an audio profile for a user including one or more equalization filters and/or one or more leakage control parameters personalized to a user's preferences. The audio profile may be accessed as the audio playback device 210 is operated by the user corresponding to the audio profile. The audio system 215 is described in greater detail below in FIG. 3.

The input interface 220 that is configured to receive input from a user. The input interface 220 may comprise one or more input devices, each configured to receive a type of input from the user. The input devices may include, but are not limited to, buttons, dials, switches, acoustic sensors, eye-tracking cameras, head-tracking sensors, other devices capable of receiving user input, etc. In one or more embodiments, the input interface 220 is implemented in a graphical user interface (GUI), wherein the input devices are virtual inputs, e.g., virtual buttons, virtual switches, virtual dials, etc. The user input may be shared with the audio system 215. The audio system 215 may use the user input for personalization of one or more equalization filters and/or a leakage control parameter.

The online system 230 maintains user profile information and content to be presented to a user. For example, the online system 230 may be a social networking system. In some embodiments, the online system 230 stores a profile of a user of the audio playback device 210. The audio playback device 210 may provide an audio profile including one or more equalization filters and/or one or more leakage control parameters personalized for a user to the online system 230, and the online system 230 can store the audio profile with the online profile of the user. The audio profile may be retrieved by other audio playback devices connected to (and/or accessible to) the online profile. The online system 230 can store an audio profile that pertains to a particular audio playback device 210. For example, the online system 230 can store a first audio profile for the headset 100 and a second audio profile for the headset 105 for a user. Accordingly, the audio profile for each audio playback device 210 is retrievable by that audio playback device for use when providing audio content to the user. As such, the user can use the audio playback device 210 according to previously set preferences without re-performing the process of personalizing the audio profile.

The network 240 may be any suitable communications network for data transmission. The network 240 is typically the Internet, but may be any network, including but not limited to a Local Area Network (LAN), a Metropolitan Area Network (MAN), a Wide Area Network (WAN), a mobile wired or wireless network, a private network, or a virtual private network. In some example embodiments, network 240 is the Internet and uses standard communications technologies and/or protocols. Thus, network 240 can include links using technologies such as Ethernet, 802.11, worldwide interoperability for microwave access (WiMAX), 3G, 4G, digital subscriber line (DSL), asynchronous transfer mode (ATM), InfiniBand, PCI express Advanced Switching, etc. In some example embodiments, the entities use custom and/or dedicated data communications technologies instead of, or in addition to, the ones described above.

Audio System

Figure 3:
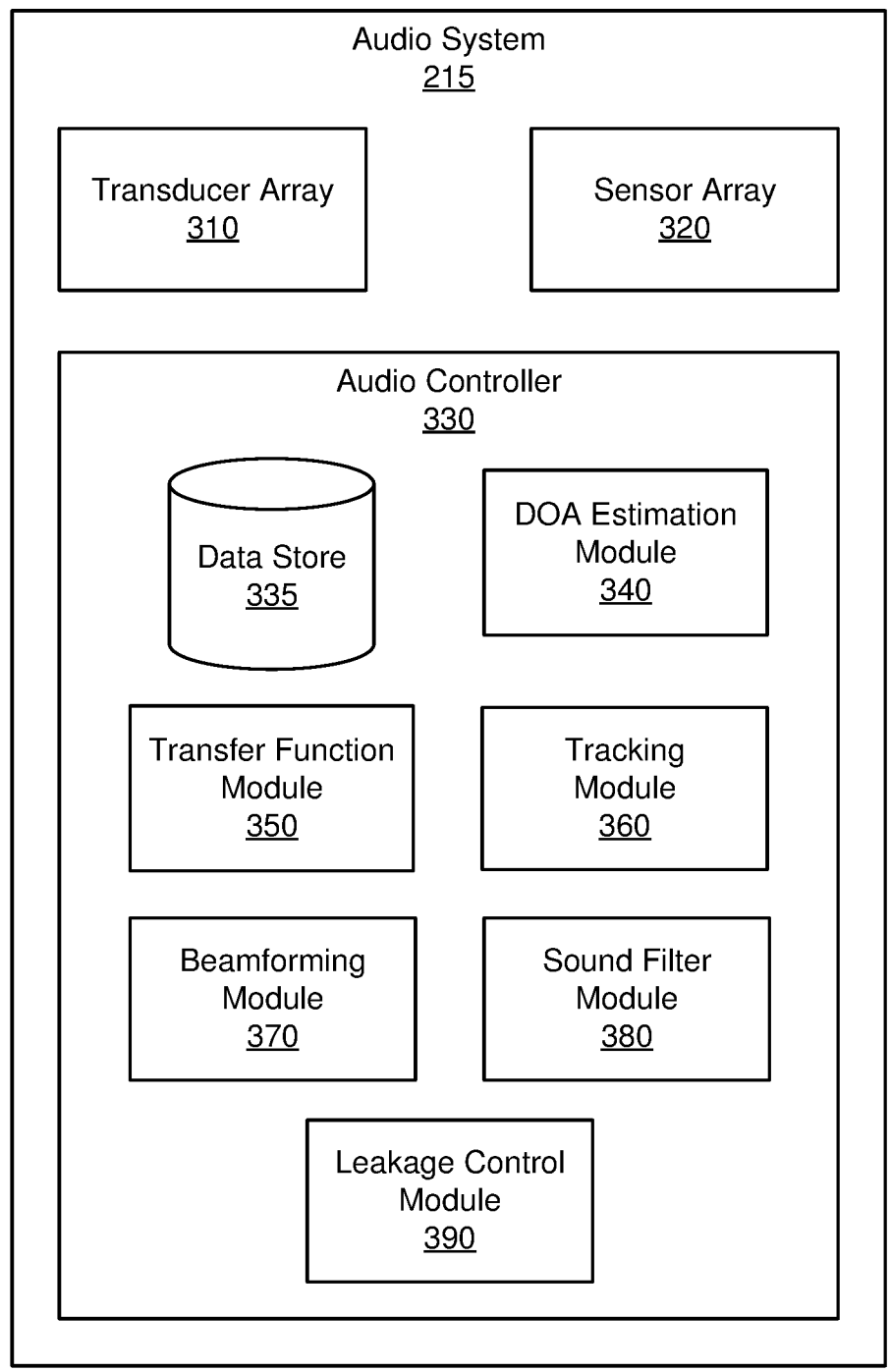
FIG. 3 illustrates an audio system, in accordance with one or more embodiments.

FIG. 3 is a block diagram of an audio system 215, in accordance with one or more embodiments. The audio system in FIG. 1A and FIG. 1B are embodiments of the audio system 215. In some embodiments, the audio system 215 employs an individualized audio output response to generate and/or to modify audio content for the user. The audio system 215 includes a transducer array 310, a sensor array 320, and an audio controller 330. Some embodiments of the audio system 215 have different components than those described here. Similarly, in some cases, functions can be distributed among the components in a different manner than is described here.

The transducer array 310 is configured to present audio content. The transducer array 310 includes a plurality of transducers. A transducer is a device that provides audio content. A transducer may be, e.g., a speaker (e.g., the speaker 160), a tissue transducer (e.g., the tissue transducer 170), some other device that provides audio content, or some combination thereof. A tissue transducer may be configured to function as a bone conduction transducer or a cartilage conduction transducer. The transducer array 310 may present audio content via air conduction (e.g., via one or more speakers), via bone conduction (via one or more bone conduction transducer), via cartilage conduction audio system (via one or more cartilage conduction transducers), or some combination thereof. In some embodiments, the transducer array 310 may include one or more transducers to cover different parts of a frequency range. For example, a piezoelectric transducer may be used to cover a first part of a frequency range and a moving coil transducer may be used to cover a second part of a frequency range. The transducers may further control for an amount of leakage by the transducer array 310 via a leakage control parameter. The leakage control parameter indicates one or more ranges of frequencies to attenuate audio output and a degree of attenuation of the audio output at each range, thereby controlling sound leakage at those ranges of frequencies.

The bone conduction transducers generate acoustic pressure waves by vibrating bone/tissue in the user's head. A bone conduction transducer may be coupled to a portion of a headset, and may be configured to be behind the auricle coupled to a portion of the user's skull. The bone conduction transducer receives vibration instructions from the audio controller 330, and vibrates a portion of the user's skull based on the received instructions. The vibrations from the bone conduction transducer generate a tissue-borne acoustic pressure wave that propagates toward the user's cochlea, bypassing the eardrum.

The cartilage conduction transducers generate acoustic pressure waves by vibrating one or more portions of the auricular cartilage of the ears of the user. A cartilage conduction transducer may be coupled to a portion of a headset, and may be configured to be coupled to one or more portions of the auricular cartilage of the ear. For example, the cartilage conduction transducer may couple to the back of an auricle of the ear of the user. The cartilage conduction transducer may be located anywhere along the auricular cartilage around the outer ear (e.g., the pinna, the tragus, some other portion of the auricular cartilage, or some combination thereof). Vibrating the one or more portions of auricular cartilage may generate: airborne acoustic pressure waves outside the ear canal; tissue born acoustic pressure waves that cause some portions of the ear canal to vibrate thereby generating an airborne acoustic pressure wave within the ear canal; or some combination thereof. The generated airborne acoustic pressure waves propagate down the ear canal toward the ear drum.

The transducer array 310 generates audio content in accordance with instructions from the audio controller 330. The transducer array 310 receives audio content from the audio controller 330. The transducer array 310 activates the transducers to present the audio content by generating one or more acoustic pressure waves. In some embodiments, the audio content is spatialized with one or more spatialization sound filters. Spatialized audio content is audio content that appears to originate from a particular direction and/or target region (e.g., an object in the local area and/or a virtual object). For example, spatialized audio content can make it appear that sound is originating from a virtual singer across a room from a user of the audio system 215. The transducer array 310 may be coupled to a wearable device (e.g., the headset 100 or the headset 105). In alternate embodiments, the transducer array 310 may be a plurality of speakers that are separate from the wearable device (e.g., coupled to an external console).

In some embodiments, the transducer array 310 uses an audio profile to adjust the audio output to the user. The audio profile comprises one or more equalization filters and/or one or more leakage control parameters. The audio profile may be individualized to a user, to a particular environment, to a particular device, etc. The equalization filters may be generated by the audio controller 330 (e.g., the sound filter module 380) or retrieved from another system (e.g., the online system 230). Similarly, the leakage control parameters may be set by the audio controller 330 (e.g., the leakage control module 390) or retrieved from another system (e.g., the online system 230). The transducer array 310 applies the audio profile to the audio content to present audio content to the user. Each of the transducers in the transducer array 310 can use the same equalization filter and/or leakage control parameter in the audio profile, or each transducer may correspond to a unique equalization filter and/or a unique leakage control parameter.

The sensor array 320 detects sounds within a local area surrounding the sensor array 320 (also referred to as "ambient noise"). The sensor array 320 may include a plurality of acoustic sensors that each detect air pressure variations of a sound wave and convert the detected sounds into an electronic format (analog or digital). The detected sounds may be characterized by one or more acoustic parameters (e.g., volume, pitch, frequencies, etc.). The plurality of acoustic sensors may be positioned on a device (e.g., headset 100 and/or the headset 105), on a user (e.g., in an ear canal of the user), on a neckband, or some combination thereof. An acoustic sensor may be, e.g., a microphone, a vibration sensor, an accelerometer, or any combination thereof. In some embodiments, the sensor array 320 is configured to monitor the audio content generated by the transducer array 310 using at least some of the plurality of acoustic sensors. Increasing the number of sensors may improve the accuracy of information (e.g., directionality) describing a sound field produced by the transducer array 310 and/or sound from the local area.

The audio controller 330 controls operation of the audio system 215. In the embodiment of FIG. 3, the audio controller 330 includes a data store 335, a DOA estimation module 340, a transfer function module 350, a tracking module 360, a beamforming module 370, a sound filter module 380, and a leakage control module 390. The audio controller 330 may be located inside a device (e.g., the headset 100 or the headset 105), in some embodiments. Some embodiments of the audio controller 330 have different components than those described here. Similarly, functions can be distributed among the components in different manners than described here. For example, some functions of the audio controller 330 may be performed external to the headset.

The data store 335 stores the equalization filters and other data for use by the audio system 215. Data in the data store 335 may include sounds recorded in the local area of the audio system 215, audio content, head-related transfer functions (HRTFs), transfer functions for one or more sensors, array transfer functions (ATFs) for one or more of the acoustic sensors, individualized audio output responses, audio profiles, sound source locations, virtual model of local area, direction of arrival estimates, sound filters, leakage control parameters, and other data relevant for use by the audio system 215, or any combination thereof.

The DOA estimation module 340 is configured to localize sound sources in the local area based in part on information from the sensor array 320. Localization is a process of determining where sound sources are located relative to the user of the audio system 215. The DOA estimation module 340 performs a DOA analysis to localize one or more sound sources within the local area. The DOA analysis may include analyzing the intensity, spectra, and/or arrival time of each sound at the sensor array 320 to determine the direction from which the sounds originated. In some cases, the DOA analysis may include any suitable algorithm for analyzing a surrounding acoustic environment in which the audio system 215 is located.

In some embodiments, the DOA estimation module 340 may also determine the DOA with respect to an absolute position of the audio system 215 within the local area. The position of the sensor array 320 may be received from an external system (e.g., some other component of a headset, an artificial reality console, a mapping server, a position sensor (e.g., the position sensor 190), etc.). The external system may create a virtual model of the local area, in which the local area and the position of the audio system 215 are mapped. The received position information may include a location and/or an orientation of some or all of the audio system 215 (e.g., of the sensor array 320). The DOA estimation module 340 may update the estimated DOA based on the received position information.

The transfer function module 350 is configured to generate one or more acoustic transfer functions. Generally, a transfer function is a mathematical function giving a corresponding output value for each possible input value. Based on parameters of the detected sounds, the transfer function module 350 generates one or more acoustic transfer functions associated with the audio system. The acoustic transfer functions may be ATFs, HRTFs, other types of acoustic transfer functions, or some combination thereof. An ATF characterizes how the microphone receives a sound from a point in space.

An ATF includes a number of transfer functions that characterize a relationship between the sound sounds and the corresponding sound received by the acoustic sensors in the sensor array 320. Accordingly, for a sound source there is a corresponding transfer function for each of the acoustic sensors in the sensor array 320. And collectively the set of transfer functions is referred to as an ATF. Accordingly, for each sound source there is a corresponding ATF. Note that the sound source may be, e.g., someone or something generating sound in the local area, the user, or one or more transducers of the transducer array 310. The ATF for a particular sound source location relative to the sensor array 320 may differ from user to user due to a person's anatomy (e.g., ear shape, shoulders, etc.) that affects the sound as it travels to the person's ears. Accordingly, the ATFs of the sensor array 320 are personalized for each user of the audio system 215.

A HRTF characterizes how an ear receives a sound from a point in space. The HRTF for a particular source location relative to a person is unique to each ear of the person (and is unique to the person) due to the person's anatomy (e.g., ear shape, shoulders, etc.) that affects the sound as it travels to the person's ears. In some embodiments, the transfer function module 350 may determine HRTFs for the user using a calibration process. In some embodiments, the transfer function module 350 may provide information about the user to a remote system. The remote system determines a set of HRTFs that are customized to the user using, e.g., machine learning, and provides the customized set of HRTFs to the audio system 215.

The tracking module 360 is configured to track locations of one or more sound sources. The tracking module 360 may compare current DOA estimates and compare them with a stored history of previous DOA estimates. In some embodiments, the audio system 215 may recalculate DOA estimates on a periodic schedule, such as once per second, or once per millisecond. The tracking module may compare the current DOA estimates with previous DOA estimates, and in response to a change in a DOA estimate for a sound source, the tracking module 360 may determine that the sound source moved. In some embodiments, the tracking module 360 may detect a change in location based on visual information received from the headset or some other external source. The tracking module 360 may track the movement of one or more sound sources over time. The tracking module 360 may store values for a number of sound sources and a location of each sound source at each point in time. In response to a change in a value of the number or locations of the sound sources, the tracking module 360 may determine that a sound source moved. The tracking module 360 may calculate an estimate of the localization variance. The localization variance may be used as a confidence level for each determination of a change in movement.

The beamforming module 370 is configured to process one or more ATFs to selectively emphasize sounds from sound sources within a certain area while de-emphasizing sounds from other areas. In analyzing sounds detected by the sensor array 320, the beamforming module 370 may combine information from different acoustic sensors to emphasize sound associated from a particular region of the local area while deemphasizing sound that is from outside of the region. The beamforming module 370 may isolate an audio signal associated with sound from a particular sound source from other sound sources in the local area based on, e.g., different DOA estimates from the DOA estimation module 340 and the tracking module 360. The beamforming module 370 may thus selectively analyze discrete sound sources in the local area. In some embodiments, the beamforming module 370 may enhance a signal from a sound source. For example, the beamforming module 370 may apply sound filters which eliminate signals above, below, or between certain frequencies. Signal enhancement acts to enhance sounds associated with a given identified sound source relative to other sounds detected by the sensor array 320.

The sound filter module 380 determines sound filters, such as the equalization filter, for the transducer array 310. A sound filter influences one or more acoustic parameters of the audio output response when applied to the audio output by the transducer array 310.

In some embodiments, the sound filter module 380 generates an equalization filter as one of the sound filters. The equalization filter may be generated based on the detected ambient noise. As described elsewhere herein, the equalization filter is configured to adjust one or more acoustic parameters of the audio output for the user when applied to the audio output by the transducer array 310. For example, the equalization filter can be configured to adjust one or more amplitudes of audio output at one or more ranges of frequencies, etc. The equalization filter may also adjust other acoustic parameters when applied to the audio output. The equalization filter may be a high pass filter, a low pass filter, a parametric individualized equalization filter, a graphic equalization filter, or any other suitable type of individualized equalization filter.

In some embodiments, the sound filter module 380 selects an equalization filter from a group of existing equalization filters, adjusts parameters of an existing equalization filter, generates a new equalization filter, or adjusts an equalization filter previously generated based on the detected ambient noise. An equalization filter may be individualized to a user, specific to one or more transducers in the transducer array (or type of transducer, e.g., bone conduction transducers), or specific to one or more audio playback devices (or type of audio playback devices, e.g., NEDs such as the headset 100). The equalization filter may be provided to the transducer array 310 to be applied to the audio output by the transducer array 310.

In some embodiments, the sound filter module 380 adjusts an equalization filter associated with a particular local area. The audio controller 330 may classify the local area surrounding the audio system 215 according to detected ambient noise by the sensor array 320. The audio controller 330 may classify the local area in different manners. In a binary fashion, the audio controller 330 uses a condition with a threshold value for an acoustic parameter. Detecting ambient noise above the threshold value for the acoustic parameter is classified as a first local and below the threshold value is classified as a second environment. For example, a volume threshold of 50 adjusted decibels (adBA) is used to classify between a noisy environment and a quiet environment. In another embodiment of classification, the audio controller 330 may have one or more conditions with Boolean logic to classify each environment. For each environment, the sound filter module 380 may maintain an equalization filter to be applied when the audio system 215 (or the audio playback device 200) is present in the environment. In some embodiments, the sound filter module 380 requests acoustic properties of a local area from a mapping server (e.g., as described below with regard to FIG. 5) for use in classification of the environment. For example, a mapping server may describe the dimensions of a room, e.g., wherein a particular volume of a room can be used to classify between environments.

In some embodiments, the sound filter module 380 maintains one or more equalization filters individualized for a user. The individualized equalization filters may be generated according to a user's anthropometric features. In other embodiments, the individualized equalization filters are generated during an initialization process incorporating user input, e.g., via the input interface 220. Moreover, the sound filter module 380 may also update the equalization filter according to user input. For example, the user provides user input to adjust the equalization filter for a noisy environment to increase audio output response in a bass range. The sound filter module 380 increases the audio output in the bass range for the equalization filter. In embodiments with equalization filters associated with specific environments, the sound filter module 380 may adjust each equalization filter individually. The sound filter module 380 can provide the one or more individualized equalization filters in an audio profile for the audio system 215 (or more generally the audio playback device 200) to the online system 230 to store the equalization filter in association with the user's profile of the online system 230.

In some embodiments, spatialization sound filters cause the audio content to be spatialized, such that the audio content appears to originate from a target region. The sound filter module 380 may use HRTFs and/or acoustic properties of a local area to generate these sound filters for spatialization of the audio content. The acoustic properties may include, e.g., a reverberation time, a reverberation level, a room impulse response, etc. In some embodiments, the sound filter module 380 calculates one or more of the acoustic properties. In some embodiments, the sound filter module 380 requests the acoustic properties from a mapping server (e.g., as described below with regard to FIG. 5).

The leakage control module 390 determines one or more leakage control parameters. The leakage control parameter is configured to adjust leakage of audio output for the user by the transducer array 310. The leakage control parameter attenuates audio output at one or more ranges of frequencies. At each range, the leakage control parameter indicates a degree of attenuation at that range. A leakage control parameter may be generated based on the detected ambient noise. In one or more embodiments, the leakage control module 390 sets a degree of attenuation inversely proportional to an amplitude of ambient noise in a particular frequency range. For example, the leakage control module 390 increases a degree of attenuation in a high frequency range based on detecting low amplitude of ambient noise in the high frequency range. The leakage control module 390 may also set the leakage control parameters according to user input, e.g., provided via the input interface 220. The leakage control module 390 may, for example, set a high degree of leakage control responsive to a user's input for such an effect. A leakage control parameter may also be set for different environments. This may be exampled with a high leakage control parameter in quiet environments with a low leakage control parameter in noisy environments. The one or more leakage control parameters may be added into audio profiles for the audio system 215 (or more generally the audio playback device 200), and may also be stored by the online system 230.

FIG. 4 illustrates a process 400 of adjusting an equalization filter based on ambient noise detection, in accordance with one or more embodiments. The process 400 is described in the perspective of an audio playback device (e.g., the audio playback device 200), but may more particularly be performed by an audio system (e.g., the audio system 215). Embodiments may include different and/or additional steps or have varying order to the steps.

The audio playback device detects 410, via an acoustic sensor of the audio playback device, ambient noise surrounding the audio playback device.

The audio playback device updates 420 an equalization filter based on the detected ambient noise, wherein the equalization filter adjusts one or more acoustic parameters of content presented by the audio playback device. The audio playback device may update the equalization filter to adjust amplitudes of audio output at one or more ranges based on the detected ambient noise. In some embodiments, the equalization filter is generated by the audio playback device, e.g., during an initialization process considering input by a user, or by another system (e.g., generated by another audio playback device and retrieved from the online system 230). In some embodiments, the audio playback device may classify an environment, wherein the classification is used to select an equalization filter. In other embodiments, the audio playback device further adjusts the equalization filter according to user input, e.g., via an input interface.

The audio playback device adjusts 430 a leakage control parameter based on the detected ambient noise, wherein the leakage control parameter adjusts an amount of leakage of audio content presented by the audio playback device. The audio playback device may also adjust the leakage according to a classification of the environment based on the detected ambient noise. The leakage control parameter may also be adjusted according to user input.

The audio playback device applies 440 the adjusted leakage control parameter and the equalization filter to audio content. The audio content is to be provided by the audio playback device to a user. Upon applying the adjusted leakage control parameter and the equalization filter, one or more acoustic parameters of the audio content are adjusted.

The audio playback device provides 450, via one or more acoustic speakers, the audio content to the user. The audio content is modified according to the leakage control parameter and the equalization filter.

In some embodiments, the adjusted leakage control parameter and/or the equalization filter may be stored in an audio profile for the audio playback device. The audio profile may be for the user, a particular type of environment, and/or the audio playback device. The audio profile may be stored on an online system or locally on the audio playback device. The user may access an individual audio profile via one of many manners, voice recognition, entering pin, another login process, etc. The user may further provide input to adjust the leakage control parameter and/or the equalization filter as audio content is provided by the audio playback device.

Exemplary Headset System

Figure 5:
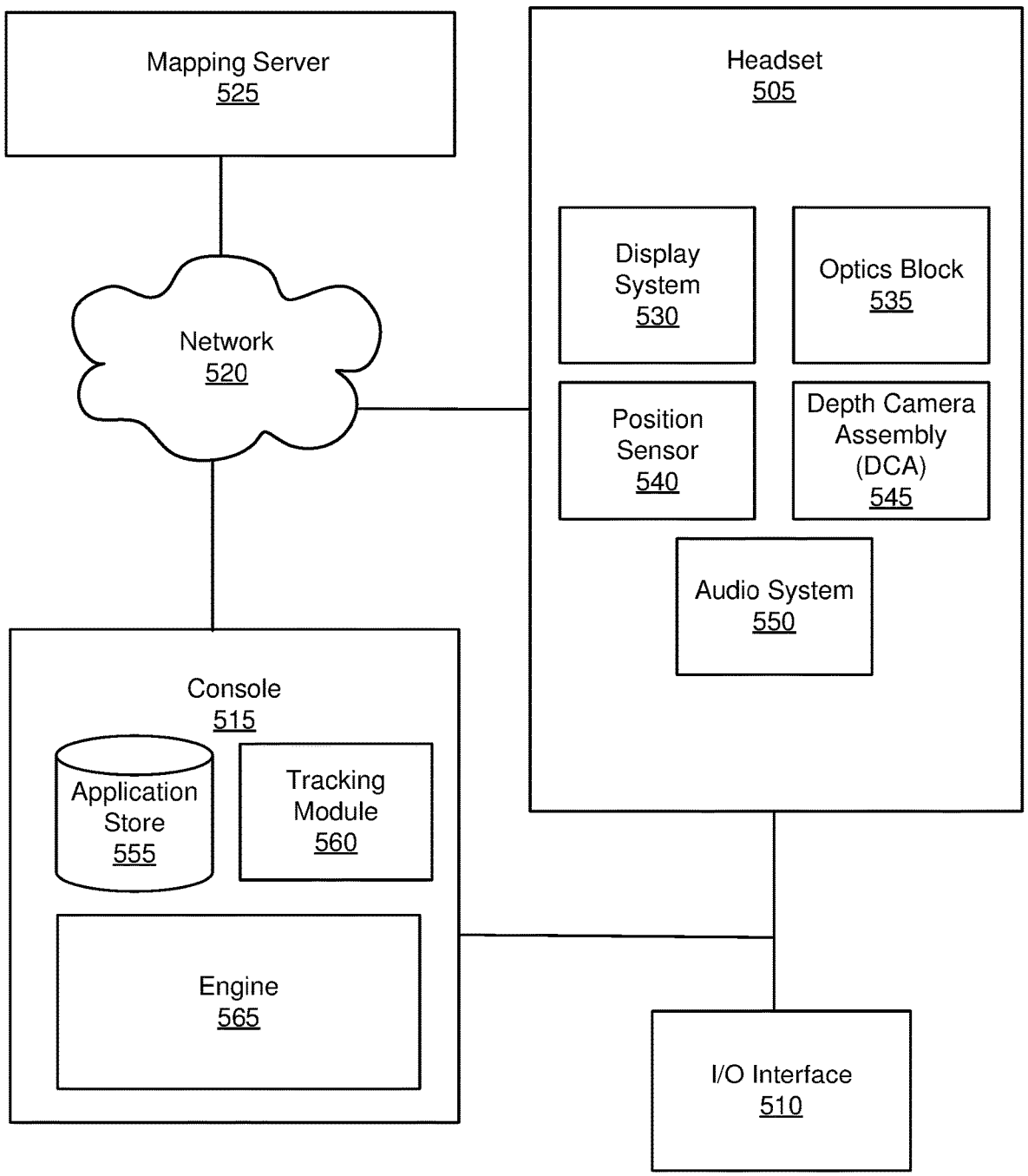
FIG. 5 is a system environment for providing audio content to a user, in accordance with an embodiment.

FIG. 5 is a system 500 that includes a headset 505, in accordance with one or more embodiments. In some embodiments, the headset 505 may be the headset 100 of FIG. 1A or the headset 105 of FIG. 1B. The system 500 may operate in an artificial reality environment (e.g., a virtual reality environment, an augmented reality environment, a mixed reality environment, or some combination thereof). The system 500 shown by FIG. 5 includes the headset 505, an input/output (I/O) interface 510 that is coupled to a console 515, the network 520, and the mapping server 525. While FIG. 5 shows an example system 500 including one headset 505 and one I/O interface 510, in other embodiments any number of these components may be included in the system 500. For example, there may be multiple headsets each having an associated I/O interface 510, with each headset and I/O interface 510 communicating with the console 515. In alternative configurations, different and/or additional components may be included in the system 500. Additionally, functionality described in conjunction with one or more of the components shown in FIG. 5 may be distributed among the components in a different manner than described in conjunction with FIG. 5 in some embodiments. For example, some or all of the functionality of the console 515 may be provided by the headset 505.

The headset 505 includes the display assembly 530, an optics block 535, one or more position sensors 540, and the DCA 545. Some embodiments of headset 505 have different components than those described in conjunction with FIG. 5. Additionally, the functionality provided by various components described in conjunction with FIG. 5 may be differently distributed among the components of the headset 505 in other embodiments, or be captured in separate assemblies remote from the headset 505.

The display assembly 530 displays content to the user in accordance with data received from the console 515. The display assembly 530 displays the content using one or more display elements (e.g., the display elements 120). A display element may be, e.g., an electronic display. In various embodiments, the display assembly 530 comprises a single display element or multiple display elements (e.g., a display for each eye of a user). Examples of an electronic display include: a liquid crystal display (LCD), an organic light emitting diode (OLED) display, an active-matrix organic light-emitting diode display (AMOLED), a waveguide display, some other display, or some combination thereof. Note in some embodiments, the display element 120 may also include some or all of the functionality of the optics block 535.

The optics block 535 may magnify image light received from the electronic display, corrects optical errors associated with the image light, and presents the corrected image light to one or both eye-boxes of the headset 505. In various embodiments, the optics block 535 includes one or more optical elements. Example optical elements included in the optics block 535 include: an aperture, a Fresnel lens, a convex lens, a concave lens, a filter, a reflecting surface, or any other suitable optical element that affects image light. Moreover, the optics block 535 may include combinations of different optical elements. In some embodiments, one or more of the optical elements in the optics block 535 may have one or more coatings, such as partially reflective or anti-reflective coatings.

Magnification and focusing of the image light by the optics block 535 allows the electronic display to be physically smaller, weigh less, and consume less power than larger displays. Additionally, magnification may increase the field of view of the content presented by the electronic display. For example, the field of view of the displayed content is such that the displayed content is presented using almost all (e.g., approximately 50 degrees diagonal), and in some cases all, of the user's field of view. Additionally, in some embodiments, the amount of magnification may be adjusted by adding or removing optical elements.

In some embodiments, the optics block 535 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 535 corrects the distortion when it receives image light from the electronic display generated based on the content.

The position sensor 540 is an electronic device that generates data indicating a position of the headset 505. The position sensor 540 generates one or more measurement signals in response to motion of the headset 505. The position sensor 190 is an embodiment of the position sensor 540. Examples of a position sensor 540 include: one or more IMUs, one or more accelerometers, one or more gyroscopes, one or more magnetometers, another suitable type of sensor that detects motion, or some combination thereof. The position sensor 540 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 505 from the sampled data. For example, the IMU integrates the measurement signals received from the accelerometers over time to estimate a velocity vector and integrates the velocity vector over time to determine an estimated position of a reference point on the headset 505. The reference point is a point that may be used to describe the position of the headset 505. While the reference point may generally be defined as a point in space, however, in practice the reference point is defined as a point within the headset 505.

The DCA 545 generates depth information for a portion of the local area. The DCA includes one or more imaging devices and a DCA controller. The DCA 545 may also include an illuminator. Operation and structure of the DCA 545 is described above with regard to FIG. 1A.

The audio system 550 provides audio content to a user of the headset 505. The audio system 550 is substantially the same as the audio system 215 described above in FIGS. 2 & 3. The audio system 550 may comprise one or acoustic sensors, one or more transducers, and an audio controller. The acoustic sensors are configured to detect ambient noise in an environment around the headset 505. The transducers are configured to present audio content to a user of the headset 505. The audio system 550 receives audio content to be provided to a user of the headset 505. The audio system 550 generates and/or updates one or more equalization filters according to detected ambient noise and applies the equalization filters to the audio content. The audio system 550 may also provide spatialized audio content to the user via one or more spatialization filters. The audio system 550 further adjusts a leakage control parameter according to detected ambient noise and applies the leakage control parameter to mitigate an amount of leakage of the content.

In some embodiments, the audio system 550 may request acoustic parameters from the mapping server 525 over the network 520. The acoustic parameters describe one or more acoustic properties (e.g., room impulse response, a reverberation time, a reverberation level, etc.) of the local area. The audio system 550 may provide information describing at least a portion of the local area from e.g., the DCA 545 and/or location information for the headset 505 from the position sensor 540. The audio system 550 may generate one or more sound filters using one or more of the acoustic parameters received from the mapping server 525, and use the sound filters to provide audio content to the user.

The I/O interface 510 is a device that allows a user to send action requests and receive responses from the console 515. An action request is a request to perform a particular action. For example, an action request may be an instruction to start or end capture of image or video data, or an instruction to perform a particular action within an application. The I/O interface 510 may include one or more input devices. Example input devices include: a keyboard, a mouse, a game controller, or any other suitable device for receiving action requests and communicating the action requests to the console 515. An action request received by the I/O interface 510 is communicated to the console 515, which performs an action corresponding to the action request. In some embodiments, the I/O interface 510 includes an IMU that captures calibration data indicating an estimated position of the I/O interface 510 relative to an initial position of the I/O interface 510. In some embodiments, the I/O interface 510 may provide haptic feedback to the user in accordance with instructions received from the console 515. For example, haptic feedback is provided when an action request is received, or the console 515 communicates instructions to the I/O interface 510 causing the I/O interface 510 to generate haptic feedback when the console 515 performs an action.

The console 515 provides content to the headset 505 for processing in accordance with information received from one or more of: the DCA 545, the headset 505, and the I/O interface 510. In the example shown in FIG. 5, the console 515 includes an application store 555, a tracking module 560, and an engine 565. Some embodiments of the console 515 have different modules or components than those described in conjunction with FIG. 5. Similarly, the functions further described below may be distributed among components of the console 515 in a different manner than described in conjunction with FIG. 5. In some embodiments, the functionality discussed herein with respect to the console 515 may be implemented in the headset 505, or a remote system.

The application store 555 stores one or more applications for execution by the console 515. An application is a group of instructions, that when executed by a processor, generates content for presentation to the user. Content generated by an application may be in response to inputs received from the user via movement of the headset 505 or the I/O interface 510. Examples of applications include: gaming applications, conferencing applications, video playback applications, or other suitable applications.

The tracking module 560 tracks movements of the headset 505 or of the I/O interface 510 using information from the DCA 545, the one or more position sensors 540, or some combination thereof. For example, the tracking module 560 determines a position of a reference point of the headset 505 in a mapping of a local area based on information from the headset 505. The tracking module 560 may also determine positions of an object or virtual object. Additionally, in some embodiments, the tracking module 560 may use portions of data indicating a position of the headset 505 from the position sensor 540 as well as representations of the local area from the DCA 545 to predict a future location of the headset 505. The tracking module 560 provides the estimated or predicted future position of the headset 505 or the I/O interface 510 to the engine 565.

The engine 565 executes applications and receives position information, acceleration information, velocity information, predicted future positions, or some combination thereof, of the headset 505 from the tracking module 560. Based on the received information, the engine 565 determines content to provide to the headset 505 for presentation to the user. For example, if the received information indicates that the user has looked to the left, the engine 565 generates content for the headset 505 that mirrors the user's movement in a virtual local area or in a local area augmenting the local area with additional content. Additionally, the engine 565 performs an action within an application executing on the console 515 in response to an action request received from the I/O interface 510 and provides feedback to the user that the action was performed. The provided feedback may be visual or audible feedback via the headset 505 or haptic feedback via the I/O interface 510.

The network 520 couples the headset 505 and/or the console 515 to the mapping server 525. The network 520 may include any combination of local area and/or wide area networks using both wireless and/or wired communication systems. For example, the network 520 may include the Internet, as well as mobile telephone networks. In one embodiment, the network 520 uses standard communications technologies and/or protocols. Hence, the network 520 may include links using technologies such as Ethernet, 802.11, worldwide interoperability for microwave access (WiMAX), 2G/3G/4G mobile communications protocols, digital subscriber line (DSL), asynchronous transfer mode (ATM), InfiniBand, PCI Express Advanced Switching, etc. Similarly, the networking protocols used on the network 520 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 520 can be represented using technologies and/or formats including image data in binary form (e.g. Portable Network Graphics (PNG)), hypertext markup language (HTML), extensible markup language (XML), etc. In addition, all or some of links can be encrypted using conventional encryption technologies such as secure sockets layer (SSL), transport layer security (TLS), virtual private networks (VPNs), Internet Protocol security (IPsec), etc.

The mapping server 525 may include a database that stores a virtual model describing a plurality of spaces, wherein one location in the virtual model corresponds to a current configuration of a local area of the headset 505. The mapping server 525 receives, from the headset 505 via the network 520, information describing at least a portion of the local area and/or location information for the local area. The mapping server 525 determines, based on the received information and/or location information, a location in the virtual model that is associated with the local area of the headset 505. The mapping server 525 determines (e.g., retrieves) one or more acoustic parameters associated with the local area, based in part on the determined location in the virtual model and any acoustic parameters associated with the determined location. The mapping server 525 may transmit the location of the local area and any values of acoustic parameters associated with the local area to the headset 505.

Additional Configuration Information

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
receiving audio content for presentation by an audio playback device;
detecting, via an acoustic sensor of the audio playback device, ambient noise in an environment surrounding the audio playback device;
determining a classification value for the environment based on one or more characteristics of the detected ambient noise, the classification value indicating an amount of ambient noise in the environment;
identifying information describing one or more anthropometric features of a user of the audio playback device, the information including dimensional measurements of physical characteristics of the user;
determining, using the classification value and the information describing the one or more anthropometric features, an equalization filter personalized to the user, wherein the equalization filter adjusts one or more acoustic parameters of the received audio content;
determining, using the classification value, a leakage control parameter, wherein the leakage control parameter sets a degree of attenuation for the received audio content that is inversely proportional to the amount of ambient noise in the environment;
applying the equalization filter and the leakage control parameter to the received audio content; and
providing, via one or more acoustic speakers, the received audio content to which the equalization filter and the leakage control parameter were applied to a user.

2. The method of claim 1, wherein determining the equalization filter further comprises:
selecting the equalization filter from a set of equalization filters according to the classification value and the anthropometric features of the user.

3. The method of claim 1, wherein determining the classification value comprises:
determining whether a decibel value of the detected ambient noise is above a threshold decibel value;
responsive to determining that the decibel value of the detected ambient noise is above the threshold value, determining a classification value indicating the environment is a noisy environment; and
responsive to determining that the decibel value of the detected ambient noise is below the threshold value, determining a classification value indicating the environment is a quiet environment.

4. The method of claim 1, wherein determining the equalization filter further comprises:
receiving user input, via an input interface; and
generating the equalization filter according to the user input.

5. The method of claim 1, wherein determining the equalization filter further comprises:
retrieving the equalization filter from an audio profile for the user.

6. The method of claim 1, wherein determining the equalization filter further comprises:
receiving user input, via an input interface; and
updating the equalization filter further based on the user input.

7. The method of claim 6, further comprising:
storing the equalization filter in an audio profile for the user.

8. The method of claim 7, wherein the audio profile is stored with an online profile on an online system configured to provide the audio profile to one or more other audio playback devices connected to the online profile.

9. A non-transitory computer-readable storage medium storing instructions that, when executed by a processor, cause the processor to perform operations comprising:
receiving audio content for presentation by an audio playback device;
detecting, via an acoustic sensor of the audio playback device, ambient noise in an environment surrounding the audio playback device;
determining a classification value for the environment based on one or more characteristics of the detected ambient noise, the classification value indicating an amount of ambient noise in the environment;
identifying information describing one or more anthropometric features of a user of the audio playback device, the information including dimensional measurements of physical characteristics of the user;
determining, using the classification value and the information describing the one or more anthropometric features, an equalization filter personalized to the user, wherein the equalization filter adjusts one or more acoustic parameters of the received audio content;
determining, using the classification value, a leakage control parameter, wherein the leakage control parameter sets a degree of attenuation for the received audio content that is inversely proportional to the amount of ambient noise in the environment;
applying the equalization filter and the leakage control parameter to the received audio content; and
providing, via one or more acoustic speakers, the received audio content to which the equalization filter and the leakage control parameter were applied to a user.

10. The storage medium of claim 9, wherein determining the equalization filter further comprises:
selecting the equalization filter from a set of equalization filters according to the classification value and the anthropometric features of the user.

11. The storage medium of claim 9, wherein determining the classification value comprises:
determining whether a decibel value of the detected ambient noise is above a threshold decibel value;
responsive to determining that the decibel value of the detected ambient noise is above the threshold value, determining a classification value indicating the environment is a noisy environment; and
responsive to determining that the decibel value of the detected ambient noise is below the threshold value, determining a classification value indicating the environment is a quiet environment.

12. The storage medium of claim 9, wherein determining the equalization filter further comprises:
receiving user input, via an input interface; and
generating the equalization filter according to the user input.

13. The storage medium of claim 9, the wherein determining the equalization filter further comprises:
retrieving the equalization filter from an audio profile for the user.

14. The storage medium of claim 9, wherein determining the equalization filter further comprises:
receiving user input, via an input interface; and
updating the equalization filter further based on the user input.

15. The storage medium of claim 14, the operations further comprising:
storing the equalization filter in an audio profile for the user.

16. The storage medium of claim 15, wherein the audio profile is stored with an online profile on an online system configured to provide the audio profile to one or more other audio playback devices connected to the online profile.

17. An audio playback device comprising:
an acoustic sensor configured to detect ambient noise in an environment surrounding the audio playback device;
an audio controller configured to:
receive audio content for presentation by an audio playback device;
determine a classification value for the environment based on one or more characteristics of the detected ambient noise, the classification value indicating an amount of ambient noise in the environment;
identify information describing one or more anthropometric features of a user of the audio playback device, the information including dimensional measurements of physical characteristics of the user;
determine, using the classification value and the information describing the one or more anthropometric features, an equalization filter, wherein the equalization filter adjusts one or more acoustic parameters of the received audio content;
determine, using the classification value, a leakage control parameter, wherein the leakage control parameter sets a degree of attenuation for the received audio content that is inversely proportional to the amount of ambient noise in the environment; and
apply the equalization filter and the leakage control parameter to the received audio content; and
one or more acoustic speakers configured to provide the received audio content to which the equalization filter and the leakage control parameter were applied.

18. The device of claim 17, wherein the controller is further configured to:
select the equalization filter from a set of equalization filters according to the classification value and the anthropometric features of the user.

19. The device of claim 17, wherein to determine the classification value for the environment the controller is further configured to:
determine whether a decibel value of the detected ambient noise is above a threshold decibel value;

responsive to determining that the decibel value of the detected ambient noise is above the threshold value, determine a classification value indicating the environment is a noisy environment; and responsive to determining that the decibel value of the detected ambient noise is below the threshold value, determine a classification value indicating the environment is a quiet environment.

20. The device of claim 17, wherein to determine, using the classification value and the information describing the one or more anthropometric features the equalization filter the controller is further configured to:

receive user input, via an input interface; and
generate the equalization filter according to the user input.

* * * * *

UNITED STATES PATENT AND TRADEMARK OFFICE
CERTIFICATE OF CORRECTION

PATENT NO.        : 11,171,621 B2
APPLICATION NO.   : 16/809518
DATED             : November 9, 2021
INVENTOR(S)       : Samuel Steele Noertker Page 1 of 1

It is certified that error appears in the above-identified patent and that said Letters Patent is hereby corrected as shown below:

In the Claims

In Column 22, Claim 13, Line 10, delete "the wherein" and insert -- wherein --, therefor.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*